United States Patent
Ichijo et al.

(10) Patent No.: US 10,600,777 B1
(45) Date of Patent: Mar. 24, 2020

(54) SEMICONDUCTOR DEVICE

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventors: Hisao Ichijo, Kanazawa (JP); Syotaro Ono, Kanazawa (JP); Hiroaki Yamashita, Hakusan (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 0 days.

(21) Appl. No.: 16/255,949

(22) Filed: Jan. 24, 2019

(30) Foreign Application Priority Data

Sep. 10, 2018 (JP) .................. 2018-168849

(51) Int. Cl.
*H01L 27/02* (2006.01)
*H01L 23/528* (2006.01)
(Continued)

(52) U.S. Cl.
CPC .......... *H01L 27/0292* (2013.01); *H01L 23/49* (2013.01); *H01L 23/528* (2013.01);
(Continued)

(58) Field of Classification Search
CPC . H01L 27/0292; H01L 23/49; H01L 27/0255; H01L 24/45; H01L 27/0296;
(Continued)

(56) References Cited

U.S. PATENT DOCUMENTS

2004/0195618 A1* 10/2004 Saito .............. H01L 29/0634
257/330
2014/0110779 A1* 4/2014 Tamaki ........... H01L 29/66727
257/330
(Continued)

FOREIGN PATENT DOCUMENTS

| JP | 2000-294779 | 10/2000 |
| JP | 2002-118258 | 4/2002 |
| JP | 2015-159235 | 9/2015 |

*Primary Examiner* — Yasser A Abdelaziez

(74) *Attorney, Agent, or Firm* — Oblon, McClelland, Maier & Neustadt, L.L.P.

(57) ABSTRACT

A semiconductor device includes a semiconductor body, first to third electrodes provided on the semiconductor body, and a control electrode. The control electrode is provided between the semiconductor body and the first electrode. The semiconductor body includes first to sixth layers. The second layer of a second conductivity type is selectively provided between the first layer of a first conductivity type and the first electrode. The third layer of the first conductivity type is selectively provided between the second layer and the first electrode. The fourth layer of the second conductivity type is provided between the first layer and the second and third electrodes. The fifth layer of the first conductivity type is selectively provided in the fourth layer and electrically connected to the first electrode. The sixth layer of the first conductivity type is provided in the fourth layer, and electrically connected to the third electrode.

12 Claims, 5 Drawing Sheets

(51) Int. Cl.
*H01L 23/00* (2006.01)
*H01L 23/49* (2006.01)
*H01L 29/78* (2006.01)
*H01L 29/739* (2006.01)

(52) U.S. Cl.
CPC .......... *H01L 24/45* (2013.01); *H01L 27/0255* (2013.01); *H01L 27/0296* (2013.01); *H01L 29/7395* (2013.01); *H01L 29/7802* (2013.01); *H01L 2224/4502* (2013.01)

(58) Field of Classification Search
CPC ............... H01L 23/528; H01L 29/7395; H01L 2224/4502; H01L 29/7802
See application file for complete search history.

(56) References Cited

U.S. PATENT DOCUMENTS

2015/0364462 A1* 12/2015 Nakaiso .............. H01L 27/0814
257/751
2017/0179109 A1* 6/2017 Toyoda ............... H01L 27/0259

* cited by examiner

SEMICONDUCTOR DEVICE

CROSS-REFERENCE TO RELATED APPLICATIONS

This application is based upon and claims the benefit of priority from Japanese Patent Application No. 2018-168849, filed on Sep. 10, 2018; the entire contents of which are incorporated herein by reference.

FIELD

Embodiments relate to a semiconductor device.

BACKGROUND

In the manufacturing processes of a semiconductor device, it is preferable to perform early-failure screening to avoid random failures during practical use. For example, it is possible in a MOSFET (Metal Oxide Semiconductor Field Effect Transistor) to remove early failures of the gate insulating film by applying a high voltage between the gate electrode and the back gate exceeding the gate voltage rating. However, when the device is maintained to have the structure capable of applying the high voltage to the gate insulating film, it is not possible to prevent the gate insulating film from receiving damage due to a high voltage exceeding the rating that is applied thereto after the screening.

DETAILED DESCRIPTION

Figure 1A:
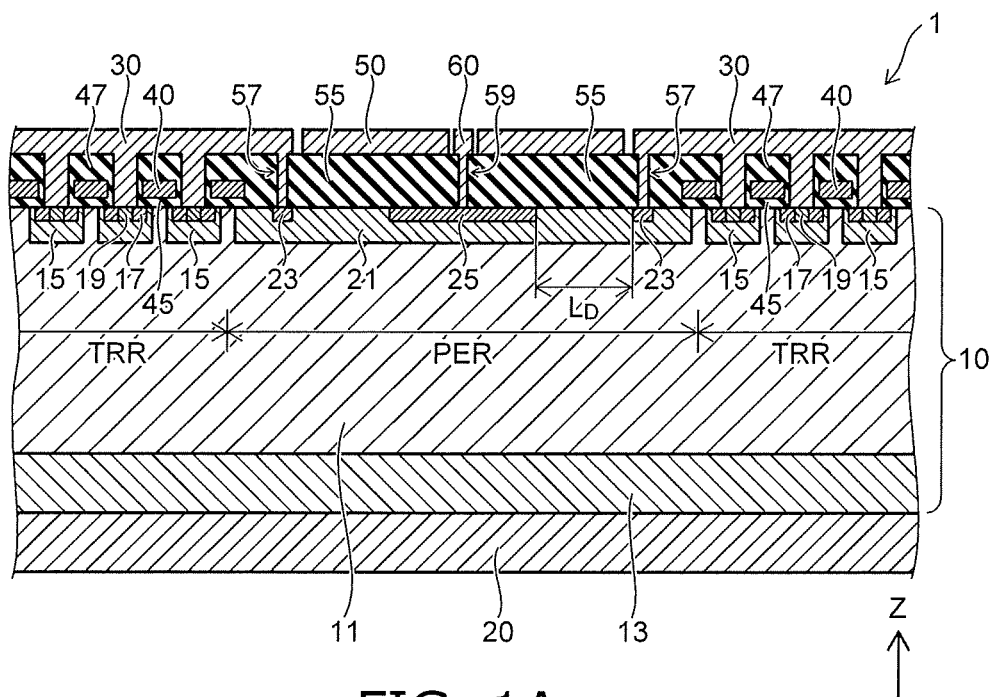
FIGS. 1A and 1B are schematic views showing a semiconductor device according to an embodiment.

According to one embodiment, a semiconductor device includes a semiconductor body, first to third electrodes and a control electrode. The first electrode is provided on the semiconductor body. The second electrode is provided on the semiconductor body with a first insulating film interposed. The second electrode is provided at a position surrounded with the first electrode when viewed from above, and is separated from the first electrode. The third electrode is provided on the semiconductor body at a position surrounded with the second electrode when viewed from above, and is separated from the second electrode. The control electrode is provided between the semiconductor body and the first electrode. The control electrode is electrically connected to the second electrode. The control electrode is electrically insulated from the semiconductor body with a second insulating film interposed, and is electrically insulated from the first electrode with a third insulating film interposed. The semiconductor body includes a first semiconductor layer of a first conductivity type, a second semiconductor layer of a second conductivity type, a third semiconductor layer of the first conductivity type, a fourth semiconductor layer of the second conductivity type, a fifth semiconductor layer of the first conductivity type, and a sixth semiconductor layer of the first conductivity type. The second semiconductor layer is selectively provided between the first semiconductor layer and the first electrode. The third semiconductor layer is selectively provided between the second semiconductor layer and the first electrode. The third semiconductor layer is electrically connected to the first electrode. The fourth semiconductor layer includes a major portion and an outer edge portion. The major portion is provided between the first semiconductor layer and the second electrode and between the first semiconductor layer and the third electrode. The outer edge portion is provided between the first semiconductor layer and the first electrode. The fifth semiconductor layer is selectively provided in the fourth semiconductor layer. The fifth semiconductor layer is positioned between the outer edge portion of the fourth semiconductor layer and the first electrode, and includes a portion electrically connected to the first electrode. The sixth semiconductor layer is provided at a position away from the fifth semiconductor layer in the fourth semiconductor layer. The sixth semiconductor layer is positioned between the major portion of the fourth semiconductor layer and the third electrode, and includes a portion electrically connected to the third electrode. The control electrode is disposed at a position capable of facing the first semiconductor layer, the second semiconductor layer and the third semiconductor layer with the second insulating film interposed.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 1B:
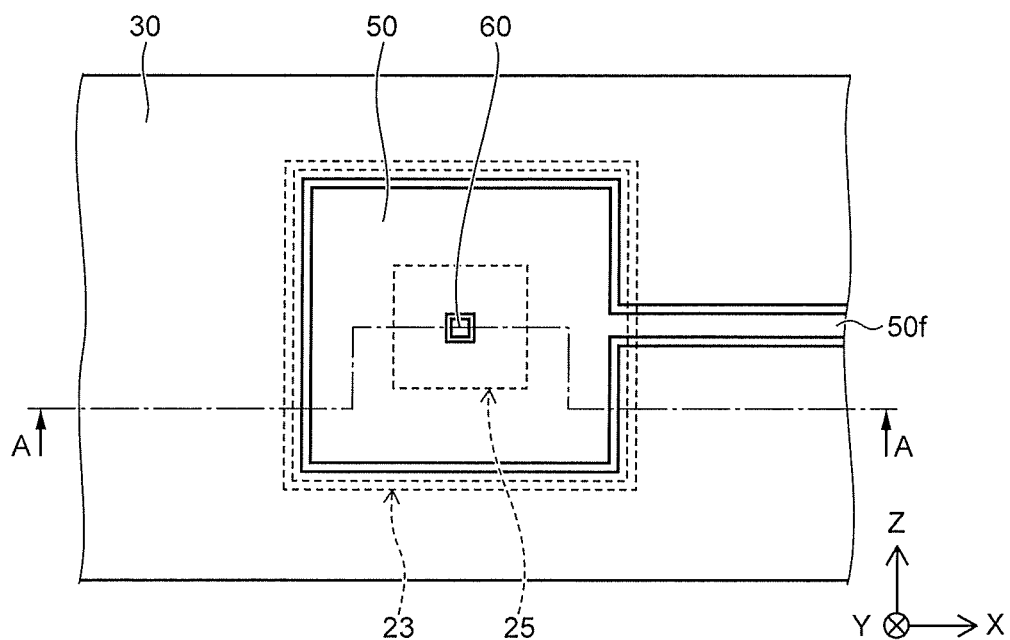

FIGS. 1A and 1B are schematic views showing a semiconductor device 1 according to an embodiment. FIG. 1A is a schematic view showing a cross section along line A-A shown in FIG. 1B. FIG. 1B is a plan view showing a portion of the upper surface of the semiconductor device 1. The semiconductor device 1 is, for example, a MOSFET. The semiconductor device 1 is not limited to this example, and may be, for example, an IGBT (Insulated Gate Bipolar Transistor).

As shown in FIG. 1A, the semiconductor device 1 includes a semiconductor body 10, a drain electrode 20, a source electrode 30, and a gate electrode 40. The semiconductor body 10 includes a transistor region TRR and a protection element region PER. Here, for example, the transistor region TRR is a region operating as a MOSFET; and the gate electrode 40 is disposed on the transistor region TRR. The protection element region PER includes, for example, a protection element preventing an overvoltage from being applied to the MOSFET.

The drain electrode 20 is provided on the back surface of the semiconductor body 10. The source electrode 30 is provided on the transistor region TRR. For example, the gate electrode 40 is disposed between the transistor region TRR and the source electrode 30.

The semiconductor body 10 includes, for example, an n-type drift layer 11, an n-type drain layer 13, a p-type diffusion layer 15, an n-type source layer 17, and a p-type contact layer 19.

The n-type drain layer 13 is provided between the n-type drift layer 11 and the drain electrode 20. The n-type drain layer 13 contacts the drain electrode 20 and includes an n-type impurity having a higher concentration than a concentration of the n-type impurity of the n-type drift layer 11.

The p-type diffusion layer 15 is provided between the n-type drift layer 11 and the source electrode 30, and contacts, for example, the n-type drift layer 11. A p-n junction is formed between the n-type drift layer 11 and the p-type diffusion layer 15. The n-type source layer 17 is selectively provided between the p-type diffusion layer 15 and the source electrode 30, and contacts the p-type diffusion layer 15. The n-type source layer 17 is electrically connected to the source electrode 30. The n-type source layer 17 includes an n-type impurity having a higher concentration than a concentration of the n-type impurity of the n-type drift layer 11. The p-type contact layer 19 is selectively provided between the p-type diffusion layer 15 and the source electrode 30, and is electrically connected to the p-type diffusion layer 15 and the source electrode 30.

The n-type source layer 17 and the p-type diffusion layer 15 are arranged in a direction along the front surface of the semiconductor body 10. The p-type contact layer 19 includes a p-type impurity having a higher concentration than a concentration of the p-type impurity of the p-type diffusion layer 15.

The gate electrode 40 is disposed to face a portion of the n-type drift layer 11, a portion of the p-type diffusion layer 15, and a portion of the n-type source layer 17 with a gate insulating film 45 interposed. Also, the gate electrode 40 is electrically insulated from the source electrode 30 by an insulating film 47. For example, the gate electrodes 40 are disposed to be away from each other in the X-direction; and the source electrode 30 is electrically connected to the n-type source layer 17 and the p-type contact layer 19 exposed between the mutually-adjacent gate electrodes 40.

The semiconductor device 1 further includes a gate pad 50 and a contact pad 60. The gate pad 50 is provided on the protection element region PER with an insulating film 55 interposed. The gate pad 50 is electrically connected to the gate electrode 40 at a not-illustrated portion, and is electrically insulated from the semiconductor body 10 by the insulating film 55.

The semiconductor body 10 further includes a p-type semiconductor layer 21, an n-type semiconductor layer 23, and an n-type semiconductor layer 25. For example, the p-type semiconductor layer 21 is formed simultaneously with the p-type diffusion layer 15, and includes a p-type impurity having the same concentration level as the p-type impurity of the p-type diffusion layer 15. For example, the n-type semiconductor layer 23 and the n-type semiconductor layer 25 are formed simultaneously with the n-type source layer 17 and include n-type impurities having the same concentration level as the n-type impurity of the n-type source layer 17.

The p-type semiconductor layer 21 is provided between the n-type drift layer 11 and the gate pad 50 and between the n-type drift layer 11 and the contact pad 60. Also, the p-type semiconductor layer 21 includes a portion positioned between the n-type drift layer 11 and the source electrode 30.

The n-type semiconductor layer 23 is selectively provided inside the p-type semiconductor layer 21, and is electrically connected to the source electrode 30. The p-type semiconductor layer 21 includes a portion positioned between the n-type drift layer 11 and the source electrode 30; and the n-type semiconductor layer 23 is provided between the portion of the p-type semiconductor layer 21 and the source electrode 30. The n-type semiconductor layer 23 is provided to be exposed at the bottom surface of a contact hole 57 provided in the insulating film 55, and is electrically connected to a portion of the source electrode 30 extending into the contact hole 57.

The n-type semiconductor layer 25 is selectively provided in the p-type semiconductor layer 21. The n-type semiconductor layer 25 is positioned between the p-type semiconductor layer 21 and the contact pad 60, and is exposed at the front surface of the semiconductor body 10. The n-type semiconductor layer 25 is exposed at the bottom surface of a contact hole 59 provided in the insulating film 55; and the contact pad 60 is electrically connected to the n-type semiconductor layer 25 via a portion extending into the contact hole 59.

As shown in FIG. 1B, for example, the gate pad 50 is provided at a position surrounded with the source electrode 30 when viewed from above. The gate pad 50 includes an interconnect portion 50f extending outside the source electrode 30. The interconnect portion 50f is electrically connected to the gate electrode 40 at a portion not-illustrated. The gate pad 50 is provided to be separated from the source electrode 30, and is electrically insulated from the source electrode 30.

The contact pad 60 is provided to be separated from the gate pad 50 at the inner side of the gate pad 50. A space is provided between the gate pad 50 and the contact pad 60; and the contact pad 60 is electrically insulated from the gate pad 50.

For example, the n-type semiconductor layer 23 is disposed to surround the gate pad 50 when viewed from above. Also, the n-type semiconductor layer 25 is provided to be positioned at the center of the gate pad 50 when viewed from above. For example, the contact pad 60 is provided to be positioned at the center of the n-type semiconductor layer 25 when viewed from above.

Figure 2:
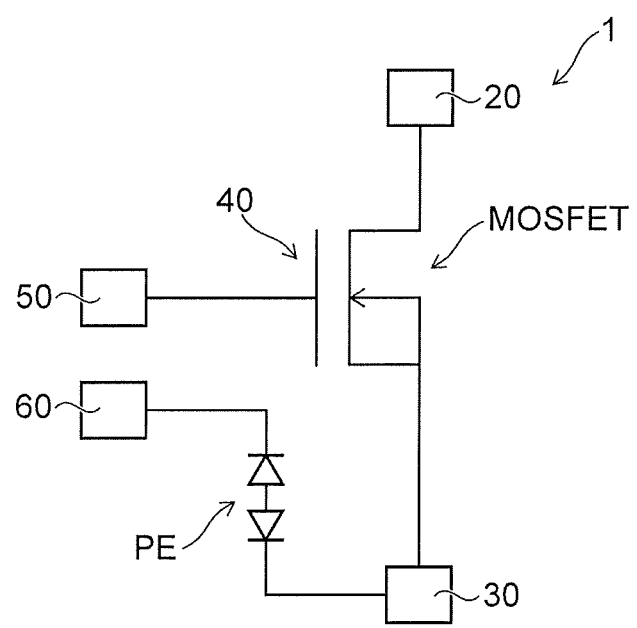
FIG. 2 is a circuit diagram showing the semiconductor device according to the embodiment.

FIG. 2 is a circuit diagram showing the semiconductor device 1 according to the embodiment. As shown in FIG. 2, the semiconductor device 1 includes the drain electrode 20 connected to the drain of the MOSFET, the source electrode 30 connected to the source thereof, and the gate pad 50 connected to the gate electrode 40.

The source electrode 30 is connected also to the back gate of the MOSFET. In other words, the source electrode 30 is connected to the p-type diffusion layer 15 via the p-type contact layer 19 (referring to FIG. 1A). Thereby, it is possible to apply voltage stress to the gate insulating film 45 by applying a voltage between the source electrode 30 and the gate pad 50. In other words, in the semiconductor device 1, a screening voltage can be applied to the gate insulating film 45 via the source electrode 30 and the gate pad 50.

Further, the source electrode 30 is connected to the contact pad 60 via a protection element PE. The protection element PE is, for example, a constant voltage element (e.g., a Zener diode) including the p-type semiconductor layer 21, the n-type semiconductor layer 23, and the n-type semiconductor layer 25.

In the manufacturing processes of the semiconductor device 1, semiconductor elements that include defects of the gate insulating film 45 are removed by screening in which a prescribed voltage is applied between the source electrode 30 and the gate pad 50. Subsequently, the gate pad 50 and the contact pad 60 are electrically connected. Thereby, it is possible to prevent a voltage higher than the breakdown voltage of the protection element PE from being applied to the gate insulating film 45. As a result, the damage of the gate insulating film 45 can be avoided; and the reliability can be increased. For example, the breakdown voltage of the protection element PE can be controlled by a spacing LD between the n-type semiconductor layer 23 and the n-type semiconductor layer 25 (referring to FIG. 1A).

Figure 3A:
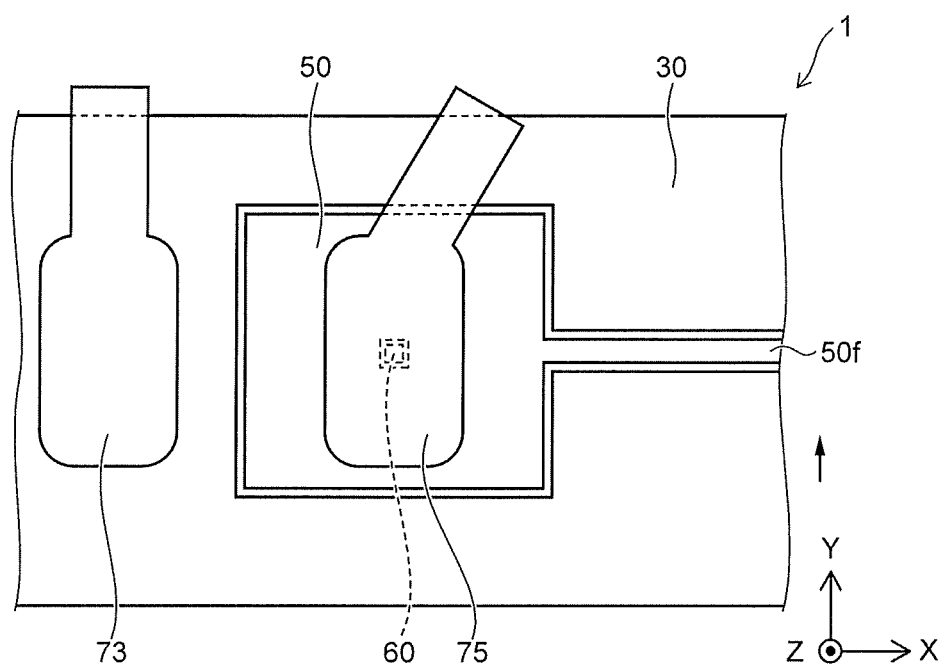
FIGS. 3A and 3B are schematic views showing the mounted configuration of the semiconductor device according to the embodiment.
Figure 3B:
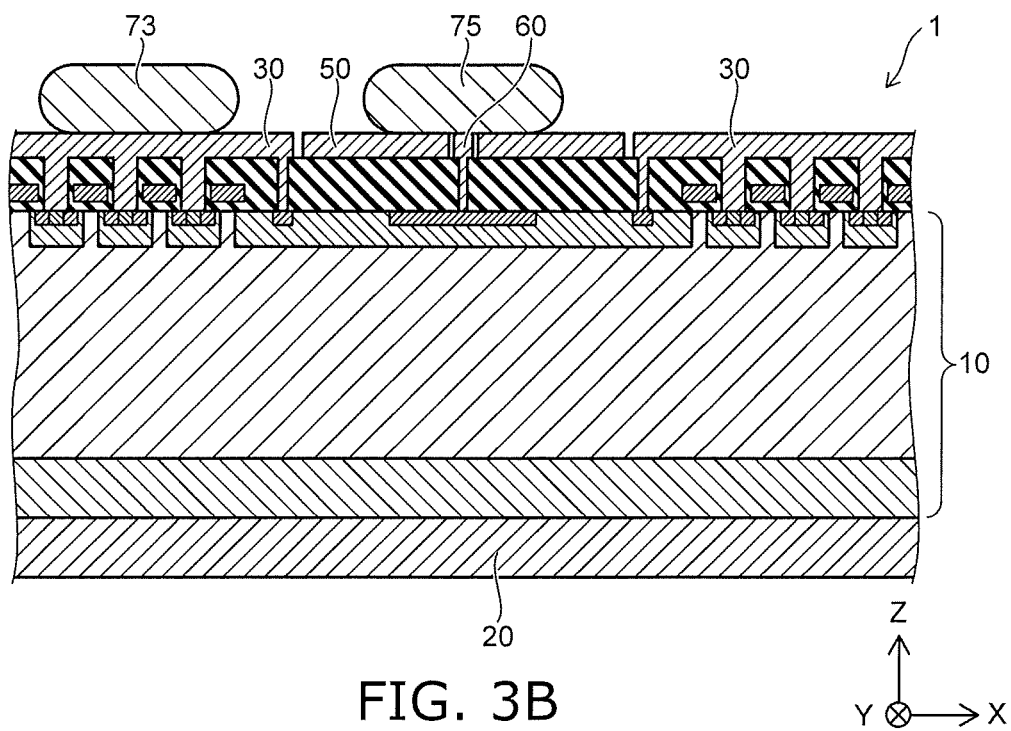

FIGS. 3A and 3B are schematic views showing the mounted configuration of the semiconductor device 1 according to the embodiment. FIG. 3A is a schematic view showing a portion of the upper surface of the semiconductor device 1. FIG. 3B is a schematic view showing a cross section of the semiconductor device 1.

As shown in FIGS. 3A and 3B, for example, bonding wires (hereinbelow, metal wires 73 and 75) are bonded respectively on the source electrode 30 and the gate pad 50. For example, the metal wire 73 electrically connects the source electrode 30 and a ground terminal (not illustrated) of a mounting substrate.

For example, the metal wire 75 electrically connects the gate pad 50 and a gate terminal (not illustrated) of the mounting substrate. Also, the metal wire 75 may connect the gate pad 50 to a gate circuit (not illustrated) provided on the mounting substrate.

For example, the contact pad 60 is positioned under the end portion of the metal wire 75 electrically connected to the gate pad 50. For example, the size of the contact pad 60 in the X-direction and the Y-direction is smaller than the size of the end portion of the metal wire 75. Accordingly, the metal wire 75 is bonded to electrically connect the gate pad 50 to the external terminal or circuit and to be electrically connected to the contact pad 60. In other words, in the embodiment, the gate pad 50 and the contact pad 60 can be electrically connected merely by bonding the metal wire 75 on the gate pad 50. Thereby, the mounting process of the semiconductor device 1 can be simplified; and the manufacturing efficiency can be improved. The embodiment is not limited to a metal wire; for example, other bonded configuration may be used in which the gate pad and an external lead are connected using a connector.

Figure 4:
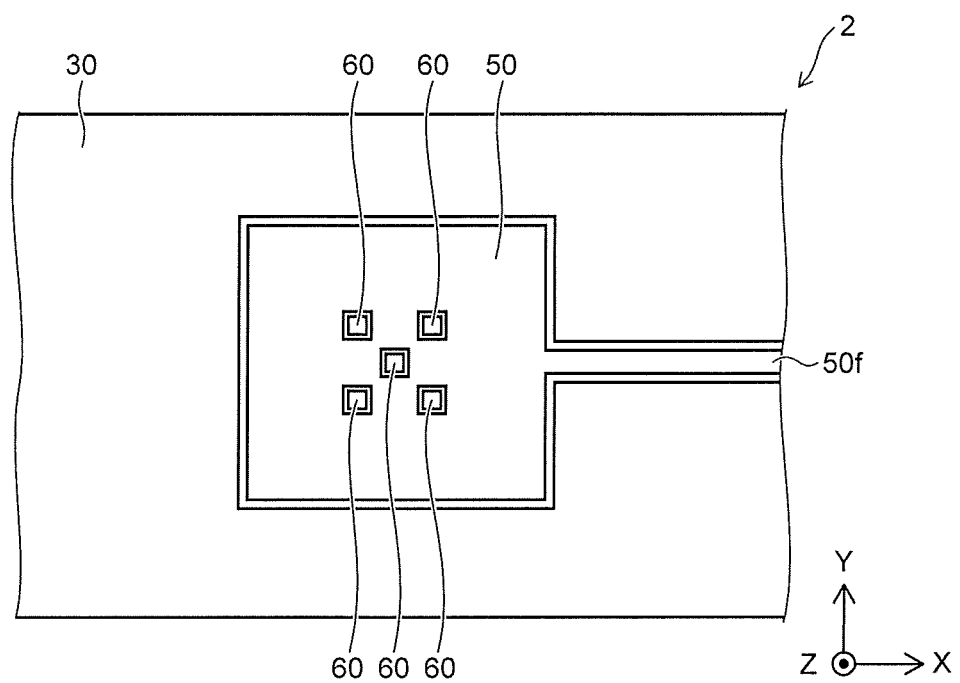
FIG. 4 is a schematic view showing a semiconductor device according to a modification of the embodiment.

FIG. 4 is a schematic view showing a semiconductor device 2 according to a modification of the embodiment. FIG. 4 is a plan view showing a portion of the upper surface of the semiconductor device 2.

As shown in FIG. 4, the semiconductor device 2 includes multiple contact pads 60. The contact pads 60 each are disposed at positions surrounded with the gate pad 50. Also, the contact pads 60 are provided to be separated from the gate pad 50 and are electrically insulated from the gate pad 50. The multiple contact pads 60 are electrically connected to the n-type semiconductor layer 25 (referring to FIG. 1A). In the example, for example, even in the case where the bonding position of the metal wire 75 (referring to FIG. 3A) is shifted from the center position of the gate pad 50, the gate pad 50 is electrically connected to one of the multiple contact pads 60.

Figure 5A:
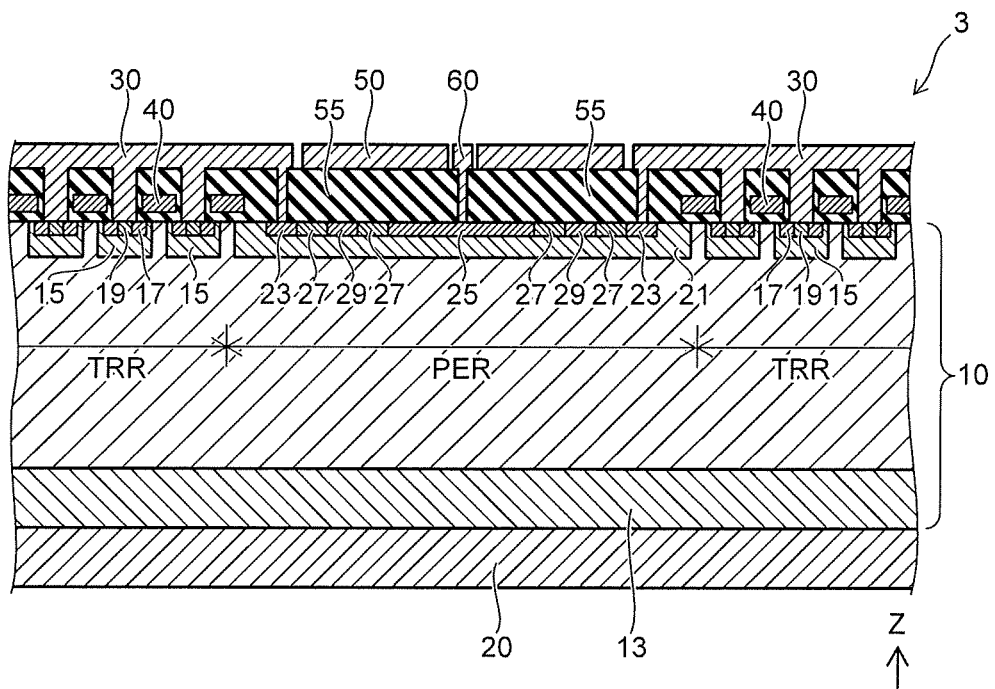
FIGS. 5A and 5B are schematic views showing a semiconductor device according to other modification of the embodiment
Figure 5B:
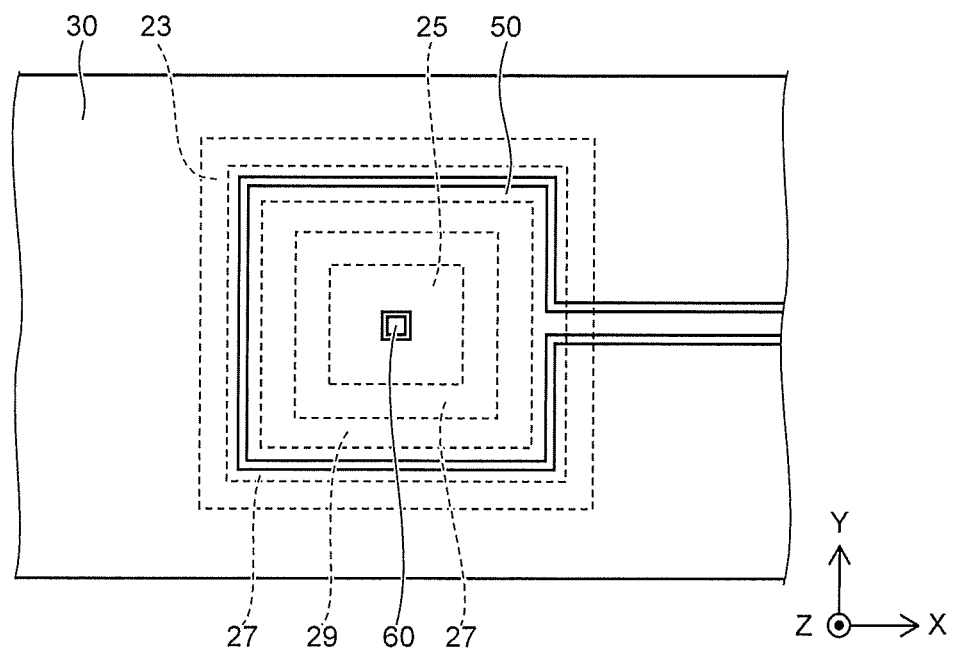

FIGS. 5A and 5B are schematic views showing a semiconductor device 3 according to other modification of the embodiment. FIG. 5A is a schematic view showing a cross section of the semiconductor device 3. FIG. 5B is a plan view showing a portion of the upper surface of the semiconductor device 3.

In the protection element region PER of the semiconductor device 3 as shown in FIG. 5A, a p-type semiconductor layer 27 and an n-type semiconductor layer 29 are arranged alternately between the n-type semiconductor layer 23 and the n-type semiconductor layer 25. The p-type semiconductor layer 27 and the n-type semiconductor layer 29 are selectively provided in the p-type semiconductor layer 21. For example, the p-type semiconductor layer 27 includes a p-type impurity having a higher concentration than a concentration of the p-type impurity in the p-type semiconductor layer 21.

As shown in FIG. 5B, the n-type semiconductor layer 23 is disposed to surround the gate pad 50 when viewed in the Z-direction. Also, the n-type semiconductor layer 25 is disposed at the center of the gate pad 50. The p-type semiconductor layer 27 and the n-type semiconductor layer 29 each are provided to surround the n-type semiconductor layer 25.

In the example, the protection element PE (referring to FIG. 2) includes the n-type semiconductor layers 23, 25, and 29 and the p-type semiconductor layer 27. The breakdown voltage of the protection element PE can be controlled by disposing the appropriate number of p-type semiconductor layers 27 and n-type semiconductor layers 29 between the n-type semiconductor layer 23 and the n-type semiconductor layer 25.

The protection element PE according to the embodiment is not limited to the example recited above; and it is sufficient for the protection element PE to have a configuration electrically connected to the source electrode 30 and the contact pad 60 and not to affect the operations of the transistor region TRR.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a semiconductor body including a first semiconductor layer of a first conductivity type;
   a first electrode provided on the semiconductor body;
   a second electrode provided on the semiconductor body with a first insulating film interposed, the second electrode being provided at a position surrounded with the first electrode when viewed from above, and being separated from the first electrode;
   a third electrode provided on the semiconductor body at a position surrounded with the second electrode when viewed from above, and being separated from the second electrode; and
   a control electrode provided between the semiconductor body and the first electrode, the control electrode being electrically connected to the second electrode, the control electrode being electrically insulated from the semiconductor body with a second insulating film interposed, and being electrically insulated from the first electrode with a third insulating film interposed, the semiconductor body further including a second semiconductor layer of a second conductivity type, a third semiconductor layer of the first conductivity type, a fourth semiconductor layer of the second conductivity type, a fifth semiconductor layer of the first conductivity type, and a sixth semiconductor layer of the first conductivity type, the second semiconductor layer being selectively provided between the first semiconductor layer and the first electrode, the third semiconductor layer being selectively provided between the second semiconductor layer and the first electrode and electrically connected to the first electrode, the fourth semiconductor layer including a major portion and an outer edge portion, the major portion being provided between the first semiconductor layer and the second electrode and between the first semiconductor layer and the third electrode, the outer edge portion being provided between the first semiconductor layer and the first electrode, the fifth semiconductor layer being selectively provided in the fourth semiconductor layer, the fifth semiconductor layer being positioned between the outer edge portion of the fourth semiconductor layer and the first electrode, and including a portion electrically connected to the first electrode, the sixth semiconductor layer being provided at a position away from the fifth semiconductor layer in the fourth semiconductor layer, the sixth semiconductor layer being positioned between the major portion of the fourth semiconductor layer and the third electrode, and including a portion electrically connected to the third electrode, the control electrode being disposed at a position capable of facing the first semiconductor layer, the second semiconductor layer and the third semiconductor layer with the second insulating film interposed.

2. The device according to claim 1, wherein the third electrode includes a portion extending through the first insulating film and being electrically connected to the sixth semiconductor layer.

3. The device according to claim 1, wherein the third electrode is positioned at a center of the second electrode when viewed from above.

4. The device according to claim 1, wherein the third electrodes is provided in a plurality, and the plurality of third electrodes is electrically connected to the sixth semiconductor layer.

5. The device according to claim 1, wherein
the semiconductor body further includes a seventh semiconductor layer of the second conductivity type selectively provided between the second semiconductor layer and the first electrode, the seventh semiconductor layer including a second conductivity type impurity having a higher concentration than a concentration of a second conductivity type impurity in the second semiconductor layer, and being electrically connected to the first electrode, and
the second semiconductor layer is electrically connected to the fifth semiconductor layer via the seventh semiconductor layer and the first electrode.

6. The device according to claim 1, wherein the fifth semiconductor layer surrounds the sixth semiconductor layer when viewed from above.

7. The device according to claim 1, wherein the fifth semiconductor layer surrounds the second electrode when viewed from above.

8. The device according to claim 1, wherein the semiconductor body further includes an eighth semiconductor layer of the first conductivity type positioned between the fourth semiconductor layer and the second electrode, the eighth semiconductor layer being provided to be away from the fifth semiconductor layer and the sixth semiconductor layer between the fifth semiconductor layer and the sixth semiconductor layer.

9. The device according to claim 8, wherein the semiconductor body further includes ninth semiconductor layers of the second conductivity type positioned between the fourth semiconductor layer and the second electrode, one of the ninth semiconductor layers being positioned between the fifth semiconductor layer and the eighth semiconductor layer, another one of the ninth semiconductor layer being positioned between the sixth semiconductor layer and the eighth semiconductor layer, the ninth semiconductor layers each including a second conductivity type impurity having a higher concentration than a concentration of a second conductivity type impurity in the fourth semiconductor layer.

10. The device according to claim 8, wherein the eighth semiconductor layer surrounds the sixth semiconductor layer when viewed from above, and the fifth semiconductor layer surrounds the eighth semiconductor layer.

11. The device according to claim 1, further comprising an electrical conductor electrically connected to the second electrode and the third electrode.

12. The device according to claim 11, wherein the electrical conductor is a bonding wire or a connector.

* * * * *